(12) United States Patent
Shei et al.

(10) Patent No.: US 7,910,395 B2
(45) Date of Patent: Mar. 22, 2011

(54) LED STRUCTURE

(75) Inventors: Shih-Chang Shei, Taipei (TW); Ming-Hung Chen, Taipei (TW); Shih-Yi Wen, Taipei (TW); Chun-Che Lee, Taipei (TW)

(73) Assignee: Helio Optoelectronics Corporation, Hsinchu (TW)

( * ) Notice: Subject to any disclaimer, the term of this patent is extended or adjusted under 35 U.S.C. 154(b) by 134 days.

(21) Appl. No.: 12/441,204

(22) PCT Filed: Sep. 13, 2006

(86) PCT No.: PCT/CN2006/002379
§ 371 (c)(1),
(2), (4) Date: Mar. 13, 2009

(87) PCT Pub. No.: WO2008/031280
PCT Pub. Date: Mar. 20, 2008

(65) Prior Publication Data
US 2010/0059733 A1    Mar. 11, 2010

(51) Int. Cl.
*H01L 21/00* (2006.01)

(52) U.S. Cl. ........... 438/88; 438/13; 438/200; 438/347; 257/E21.053; 257/E21.126; 257/E21.127; 257/E21.32; 257/E21.561; 257/E21.562

(58) Field of Classification Search .................. 438/13, 438/40, 88, 200, 347; 257/E21.126, E21.127, 257/E21.32, E21.561, E21.562
See application file for complete search history.

(56) References Cited

U.S. PATENT DOCUMENTS

| 5,945,689 | A * | 8/1999 | Koike et al. ............ 257/88 |
| 6,853,011 | B2 | 2/2005 | Lin |
| 6,998,642 | B2 | 2/2006 | Lin et al. |
| 2001/0045564 | A1* | 11/2001 | Koike et al. ............ 257/88 |

* cited by examiner

*Primary Examiner* — David Nhu
(74) *Attorney, Agent, or Firm* — Stites & Harbison PLLC; Juan Carlos A. Marquez, •Esq.

(57) ABSTRACT

An LED structure includes a first substrate; an adhering layer formed on the first substrate; first ohmic contact layers formed on the adhering layer; epi-layers formed on the first ohmic contact layers; a first isolation layer covering the first ohmic contact layers and the epi-layers at exposed surfaces thereof; and first electrically conducting plates and second electrically conducting plates, both formed in the first isolation layer and electrically connected to the first ohmic contact layers and the epi-layers, respectively. The trenches allow the LED structure to facilitate complex serial/parallel connection so as to achieve easy and various applications of the LED structure in the form of single structures under a high-voltage environment.

24 Claims, 17 Drawing Sheets

LED STRUCTURE

CROSS-REFERENCE TO RELATED APPLICATIONS

This application is a 35 USC 371 application of PCT/CN 06/02379 filed on Sep. 13, 2006. The content of the specification is incorporated herein by reference.

BACKGROUND OF THE INVENTION

1. Technical Field

The present invention relates to LED structures, and more particularly, to a high-power LED structure operable in a high-voltage environment.

2. Description of Related Art

U.S. Pat. No. 6,853,011 has disclosed a light emitting epi-layer structure containing a temporary substrate of absorption light type on one side while the other side thereof is then adhered to a transparent substrate of light absorption free by BCB bonding layer. After the temporary substrate is removed, the resulted light emitting structure is then patterned to form a connection channel to connect the first ohmic contact electrode and form an isolation trench to separate the active layer of the light emitting structure into two parts. Thereafter, a second ohmic contact electrode on the cladding layer and a bonding metal layer filled in the first channel and on second ohmic contact electrode are successively formed. The resulted LED structure is hence convenient for flip-chip structure since two bonding metal layers have the same altitude.

U.S. Pat. No. 6,998,642 has disclosed a semiconductor structure with two light emitting diodes in series connection. The semiconductor structure comprises two light emitting diodes (LEDs) having the same stack layers and abutting each other but spaced by an isolation trench. The stack layers from a bottom thereof include a thermal conductive substrate, a nonconductive protective layer, a metal adhering layer, a mirror protective layer, a p-type ohmic contact epi-layer, an upper cladding layer, an active layer, and a lower cladding layer. Two p-type ohmic contact metal electrodes for two LEDs are formed on an interface between the mirror protective layer and the ohmic contact epi-layer and buried in the mirror protective layer.

The stack layers have first trenches formed therein which expose the upper cladding layer and electrical connecting channels to connect p-type electrodes. The isolation trench is formed by patterning the exposed upper cladding layer until further exposing the nonconductive protective layer. Two n-type electrodes are formed on the lower cladding layer of two LEDs. A dielectric layer is deposited to fill the isolation trench and covered a sidewall of the first trench so that it can electrically isolate layers of the stack layers of the second LED while a metal connection trace formed thereon to connect the p-type ohmic contact electrode of the first LED and n-type of ohmic electrode of second LED.

Although the structure of U.S. Pat. No. 6,853,011 is applicable to flip-chip structures, it would be impossible to connect two of the LED structures without assistance of submounts. Besides, complexity of the flip-chip process could be significantly increased because there are numerous chips to be processed. On the other hand, while the structure of U.S. Pat. No. 6,998,642 enables the electrical connection between LEDs, metal-to-metal adherence where such electrical connection relies could be only achieved through a complex process, resulting in problems related to weak productivity and high manufacturing costs. Moreover, since the nonconductive layer is located at the boundary between the LEDs, the metal connection trace could only connect two electrically conducting plates and it would still be impossible to achieve a circuit layout with further complexity if no submounts are provided.

Thus, in view of the inconvenience and defects reflected in their configurations and applications, the existing LED structures need to be improved. Although all relevant manufactures have saved no efforts to solve the aforementioned problems, an applicable approach has not been developed. It is still a challenge for the manufacturers to provide an appropriate structure to all related products with the attempt solving the aforementioned problems. Hence, creation of a novel LED structure has become an immediate R&D task and a common goal of the industry.

Considering the defects of the known LED structures, the inventor of the present invention, aiming at creating a novel LED structure that reforms the defects of the existing LED structures and possesses improved practicality, and basing on his years of practical experience and professional knowledge in designing and manufacturing this product, has applied appropriate theories and performing, active researches and innovation. After unceasing researches and repeated retrofit, the inventor herein discloses the present invention that exactly provides practical utility.

SUMMARY OF THE INVENTION

The primary objective of the present invention is to provide a novel LED structure that remedies the defects of the conventional products while facilitating interconnection between LEDs and easy manufacture of an LED single-structure that has improved elaborateness and is operable in a high-voltage environment, thus being more utility.

To achieve the objective of the present invention, the LED structure according to a first embodiment of the present invention comprises: a first substrate having a first surface and a second surface; an adhering layer formed on the first surface; at least two first ohmic contact layers formed on the adhering layer; at least two epi-layers, wherein a first trench is formed between each two adjacent said epi-layers, and each said epi-layer includes: a lower cladding layer formed on one said first ohmic contact layer; an active layer formed on the lower cladding layer; and an upper cladding layer formed on the active layer; a first isolation layer covering the first ohmic contact layers and the upper cladding layers at exposed surfaces thereof, and formed between each two adjacent said first ohmic contact layers, wherein the first isolation layer has first openings and second openings formed at the exposed surfaces of the upper cladding layers and the first ohmic contact layers, respectively; at least two first electrically conducting plates, each formed in one said first opening and electrically connected to one said upper cladding layer; and at least two second electrically conducting plates, each formed in one said second opening and electrically connected to one said first ohmic contact layer.

To achieve the objectives of the present invention and solve the technical problems of the prior arts, the following means are proposed in the present invention.

In the aforesaid LED structure, each of the first ohmic contact layers is a p-type ohmic contact layer.

In the aforesaid LED structure, the lower cladding layer is a p-type AlGaInP cladding layer and the upper cladding layer is an n-type AlGaInP cladding layer.

In the aforesaid LED structure, the active layer is in a form of a single hetero-structure (SH), a double hetero-structure (DH) or multiple quantum wells (MQW).

In the aforesaid LED structure, a second ohmic contact layer is formed between the upper cladding layer and the first electrically conducting plates.

In the aforesaid LED structure, the first substrate is a transparent substrate and the adhering layer is a transparent adhering layer, and a mirror layer is formed on the second surface.

In the aforesaid LED structure, the adhering layer is a transparent adhering layer, and a mirror layer is formed between the first substrate and the adhering layer.

In the aforesaid LED structure, a submount has a third surface whereon at least two third electrically conducting plates and at least two fourth electrically conducting plates are formed, wherein the submount is formed with a plurality of traces for electrically connecting the third electrically conducting plates and the fourth electrically conducting plates, each of the third electrically conducting plates and the fourth electrically conducting plates being electrically connected to the corresponding first electrically conducting plate and/or the second electrically conducting plate via one or more solder joints, and the first substrate being a transparent substrate while the adhering layer being a transparent adhering layer.

In the aforesaid LED structure, a mirror layer is formed on the third surface while not covering the third and fourth electrically conducting plates.

In the aforesaid LED structure, a mirror layer is formed on the first isolation layer.

In the aforesaid LED structure, a first conductor layer is formed with at least one conductor and covers the first isolation layer, each conductor having two opposite ends electrically connected to the second electrically conducting plate and the first electrically conducting plate of different units, respectively.

To achieve the objective of the present invention, the LED structure according to a second embodiment of the LED structure of the present invention comprises: a first substrate having a first surface and a second surface; an adhering layer formed on the first surface; at least two first ohmic contact layers formed on the adhering layer; at least two epi-layers, wherein each said epi-layer includes: a lower cladding layer formed on one said first ohmic contact layer; an active layer formed on the lower cladding layer; an upper cladding layer formed on the active layer; and a first trench vertically passing through the upper cladding layer and the active layer and entering a part of the lower cladding layer; a first isolation layer covering the upper cladding layers and formed between each two adjacent said epi-layers and between each two adjacent said first ohmic contact layers, wherein the first isolation layer has a first opening formed on each said upper cladding layer and a second opening formed at an inner side of each said first trench; at least two first electrically conducting plates, each formed in one said first opening and electrically connected to one said upper cladding layer; and at least two second electrically conducting plates, each formed in one said second opening, having an extending portion extending downward to vertically pass through the epi-layer and electrically connect with the first ohmic contact layer.

To achieve the objectives of the present invention and solve the technical problems of the prior arts, the following means are proposed in the present invention.

In the aforesaid LED structure, each of the first ohmic contact layers is a p-type ohmic contact layer.

In the aforesaid LED structure, the lower cladding layer is a p-type AlGaInP cladding layer and the upper cladding layer is an n-type AlGaInP cladding layer.

In the aforesaid LED structure, the active layer is in a form of a single hetero-structure (SH), a double hetero-structure (DH) or multiple quantum wells (MQW).

In the aforesaid LED structure, the first trench has the first isolation layer formed therein.

In the aforesaid LED structure, a second ohmic contact layer is formed between the upper cladding layer and the first electrically conducting plate.

In the aforesaid LED structure, the first substrate is a transparent substrate and the adhering layer is a transparent adhering layer, and a mirror layer is formed on the second surface.

In the aforesaid LED structure, the adhering layer is a transparent adhering layer, and a mirror layer is formed between the first substrate and the adhering layer.

In the aforesaid LED structure, a submount has a third surface whereon at least two third electrically conducting plates and at least two fourth electrically conducting plates are formed, wherein the submount is formed with a plurality of traces for electrically connecting the third electrically conducting plates and the fourth electrically conducting plates, each of the third electrically conducting plates and the fourth electrically conducting plates being electrically connected to the corresponding first electrically conducting plate and/or the second electrically conducting plate via one or more solder joints, and the first substrate being a transparent substrate while the adhering layer being a transparent adhering layer.

In the aforesaid LED structure, a mirror layer is formed on the submount while not covering the third and fourth electrically conducting plates.

In the aforesaid LED structure, a mirror layer is formed on the first isolation layer.

In the aforesaid LED structure, surfaces of the first electrically conducting plates and the second electrically conducting plates have an identical altitude.

In the aforesaid LED structure, a second conductor layer is formed with at least one conductor and covers the first isolation layer, each conductor having two opposite ends electrically connected to the first electrically conducting plate and the second electrically conducting plate of different units, respectively.

As compared with the conventional devices, the present invention provides evident advantages and beneficial effects. Through the previously described configurations, the present invention provides at least the following virtues and functions.

First, the present invention enables convenient interconnection between LEDs, and easy manufacture of LED single-structures operable in a high-voltage environment, thereby improving utility of the LED structure.

Secondly, an LED structure according to the present invention can be produced through a simple semiconductor process. In such LED structure, since only a submount requires an additional mask and the existing process is applicable to the disclosed LED structure, the cost is relatively low and thus the manufacture is beneficial, thereby ensuring industrial applicability of the present invention.

In addition, since an interconnection layout between the LED structures of the present invention is achievable by using submounts, design of junction circuits is simplified.

Furthermore, as compared with metal-to-metal adherence that requires high heat operation, the adhering layer of the present invention needs only economical low-temperature operation and provides the advantages of low costs and high yield.

At last, the present invention facilitates simplifying the junction circuit and enables high-voltage LED chips being compact and having high luminance, thereby downsizing and lightening resultant LED lighting devices.

To sum up, the present invention provides an LED structure, which comprises: a first substrate; an adhering layer formed on the first substrate; first ohmic contact layers formed on the adhering layer; epi-layers formed on the first ohmic contact layers; a first isolation layer covering the first ohmic contact layers and the epi-layers at exposed surfaces thereof; and first electrically conducting plates and second electrically conducting plates both formed in the first isolation layer and electrically connected to the first ohmic contact layers and the epi-layers, respectively. The trenches allow the LED structure to facilitate complex serial/parallel connection so as to achieve easy and various applications of the LED structure in the form of single structures under a high-voltage environment. The present invention provides the previously recited advantages and practical effects while presenting significant structural and functional improvements, thus realizing remarkable progress in technology and producing useful functions. Besides, as compared with the conventional LED structures, the present invention provides improved and outstanding virtues, and thus is more practical and industrially applicable. Therefore, the subject matter of the present invention is exactly novel, advanced and functional.

While the above description is merely a summary of the technical approach according to the present invention, for further illustrating the technical means proposed by the present invention allowing people skilled in the art to use the present invention, and clarifying the above and other objectives, features and advantages of the present invention, some preferred embodiment will be given below with reference to the accompanying drawings.

| | |
|---|---|
| 10: pre-processing LED structure | 11: temporary substrate |
| 12: etch-stop layer | 20: LED structure |
| 21: first substrate | 211: first surface |
| 212: second surface | 22: adhering layer |
| 23: first ohmic contact layer | 231: exposed portion |
| 24: epi-layer | 241: lower cladding layer |
| 242: active layer | 243: upper cladding layer |
| 25: first isolation layer | 251: first opening |
| 252: second opening | |
| 26: first electrically conducting plate | |
| 27: second electrically conducting plate | |
| 28: LED | 291: first trench |
| 292: second ohmic contact layer | 293: first conductor layer |
| 30: LED structure | 31: first isolation layer |
| 32: fifth electrically conducting plate | |
| 33: sixth electrically conducting plate | |
| 331: extending portion | 34: first trench |
| 35: first opening | 36: second opening |
| 37: second conductor layer | 50: submount |
| 51: third surface | |
| 52: third electrically conducting plate | |
| 53: fourth electrically conducting plate | |
| 60: solder joint | A1, A2, A3 . . . : unit |
| B1, B2, B3 . . . : unit | |

DETAILED DESCRIPTION OF THE PREFERRED EMBODIMENT

To further illustrate the technical means and effects provided by the present invention to achieve the intended objective, the specific means, configurations, features and virtues of the LED structure proposed by the present invention will be explained below through the preferred embodiments with reference to the accompanying drawings.

While the features and the executive details of the present invention are to be read in conjunction with the accompanying drawings, it is to be understood that layers contained in the LED structure are made through the known semiconductor manufacturing techniques which need no to be described in any length herein. Besides, for eliminating superfluous descriptions, in the following descriptions, the term, "etching process" or "etching method", is defined as a synonym to a complete photolithography process. It is also to be noted that the number of LEDs used in the present invention is not limited to those shown in the following embodiments, but may freely form LED arrays with various dimensions.

First Preferred Embodiment

Figure 1A:
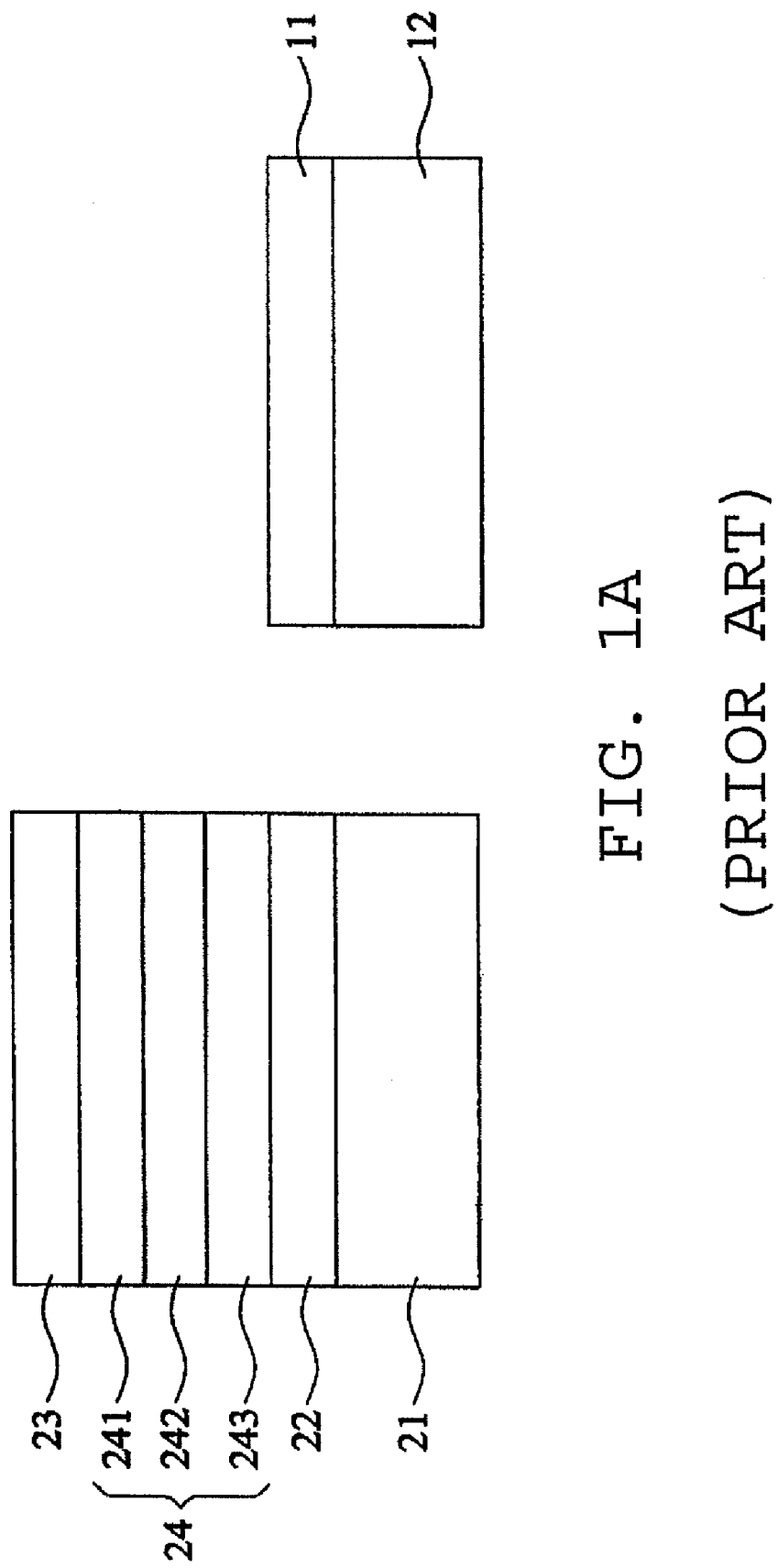
FIG. 1A is a schematic drawing showing a first substrate and a pre-processing LED structure to be assembled together.
Figure 1B:
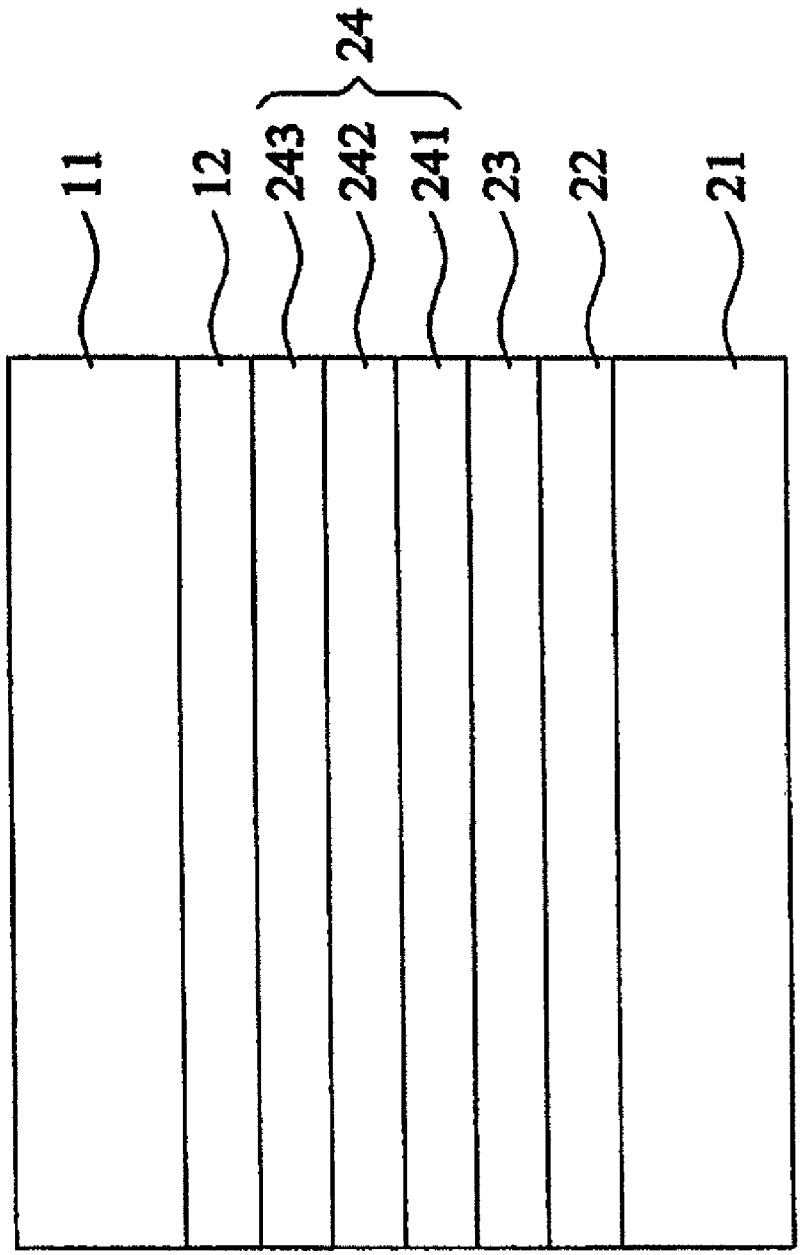
FIG. 1B is a schematic drawing showing the first substrate and the pre-processing LED structure assembled together.
Figure 1C:
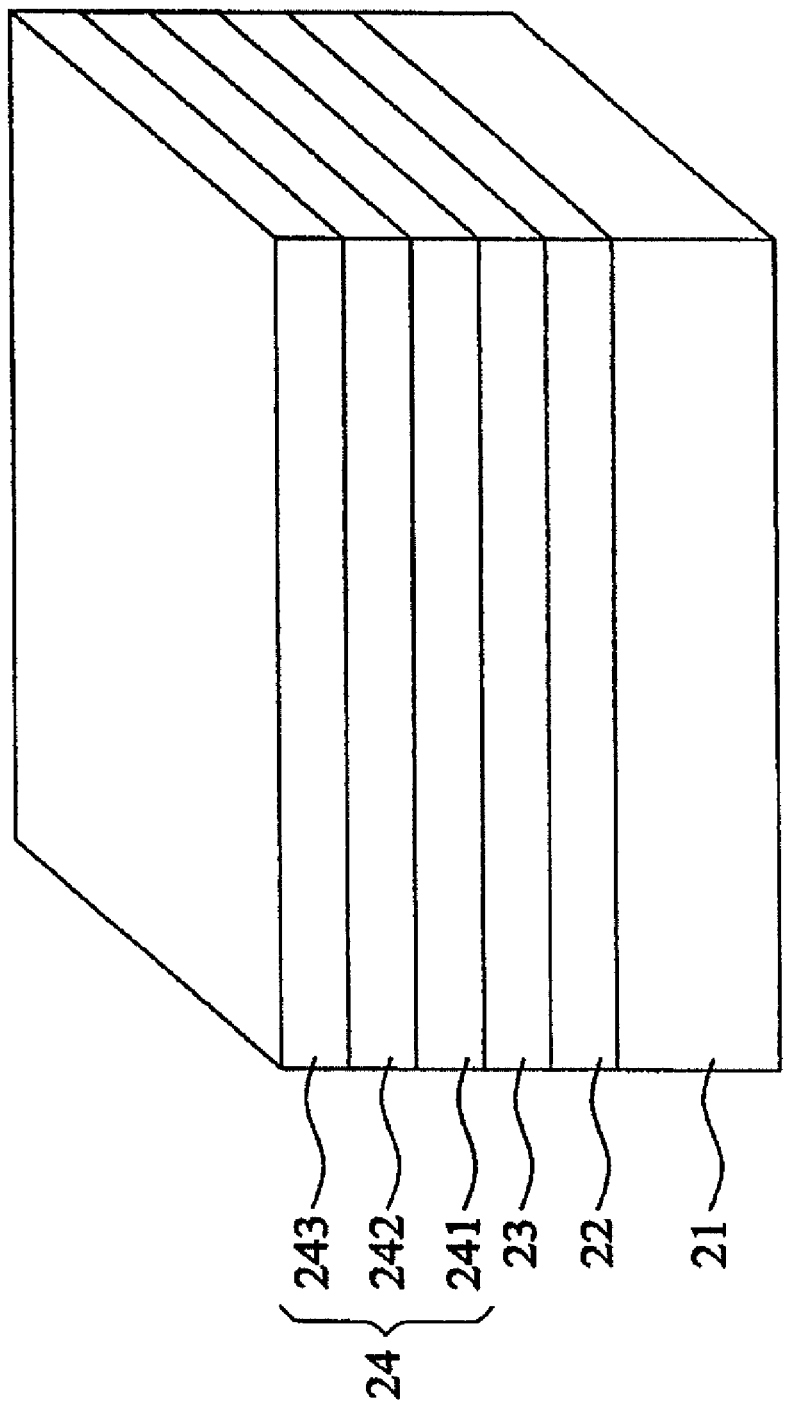
FIG. 1C is a schematic drawing according to FIG. 1B wherein a temporary substrate and an etch-stop layer have been removed therefrom.

Please refer to FIGS. 1A, 1B and 1C for a schematic drawing showing a conventional first substrate 21 and a pre-processing LED structure 10 to be assembled together, a schematic drawing showing the first substrate 21 and the pre-processing LED structure 10 assembled together, and a schematic drawing according to FIG. 1B showing a temporary substrate 11 and an etch-stop layer 12 removed therefrom.

Conventionally, the pre-processing LED structure 10 that will later receive unit division, isolation layer formation and electrically conducting plate installation is formed on a wafer through a semiconductor process. However, since being undesirably thick and opaque and thus unfavorable to practical applications of the LED structure, the wafer has to be removed later. In other words, the wafer is a substrate for temporary use during the process for constructing the LED structure, and thus is herein referred to as the temporary substrate 11.

Among the known methods for removing the temporary substrate 11, etching would be the most popular method. For protecting the LED structure from being damaged under excessive etching, the etch-stop layer 12 is provided. The etch-stop layer 12 would be mostly etched during the wafer etching process, and thus facilitates protecting the LED structure. The pre-processing LED structure 10 can be produced through the above procedures.

Please refer to FIGS. 2 to 6C for the LED structure 20 according to one embodiment of the present invention. The LED structure 20 includes a first substrate 21, an adhering layer 22, at least two first ohmic contact layers 23, at least two epi-layers 24, a first isolation layer 25, at least two first electrically conducting plates 26, and at least two second electrically conducting plates 27.

The first substrate 21 has a first surface 211 and a second surface 212 and primarily serves to support the whole LED structure 20. The first substrate 21 may be a monocrystal substrate, a polycrystal substrate, or a noncrystal substrate, such as a substrate made of glass, sapphire, SiC, GaP, GaAsP, ZnSe, ZnS, AmSSe, etc. Besides, the first substrate 21 may be a transparent substrate or an opaque substrate depending on the desired light-emitting directions or mirror-layer arrangement of the LED structure 20. When dual-direction light-emitting allowing upward/downward light-emitting is desired, the first substrate 21 has to be transparent.

The adhering layer 22 is formed on the first surface 211 for combining the first substrate 21 and the first ohmic contact layers 23. The adhering layer 22 is one selected from B-staged benzocyclobutene (BCB), epoxy, silicone, polymethyl methacry (PMMA), a polymer, spin-on glass (SOG), etc. The adhering layer 22 may be a transparent adhering layer or an opaque adhering layer depending on the light-emitting directions or mirror-layer arrangement of the LED structure 20. When dual-direction light-emitting allowing upward/downward light-emitting is desired, the adhering layer 22 has to be transparent.

Figure 2:
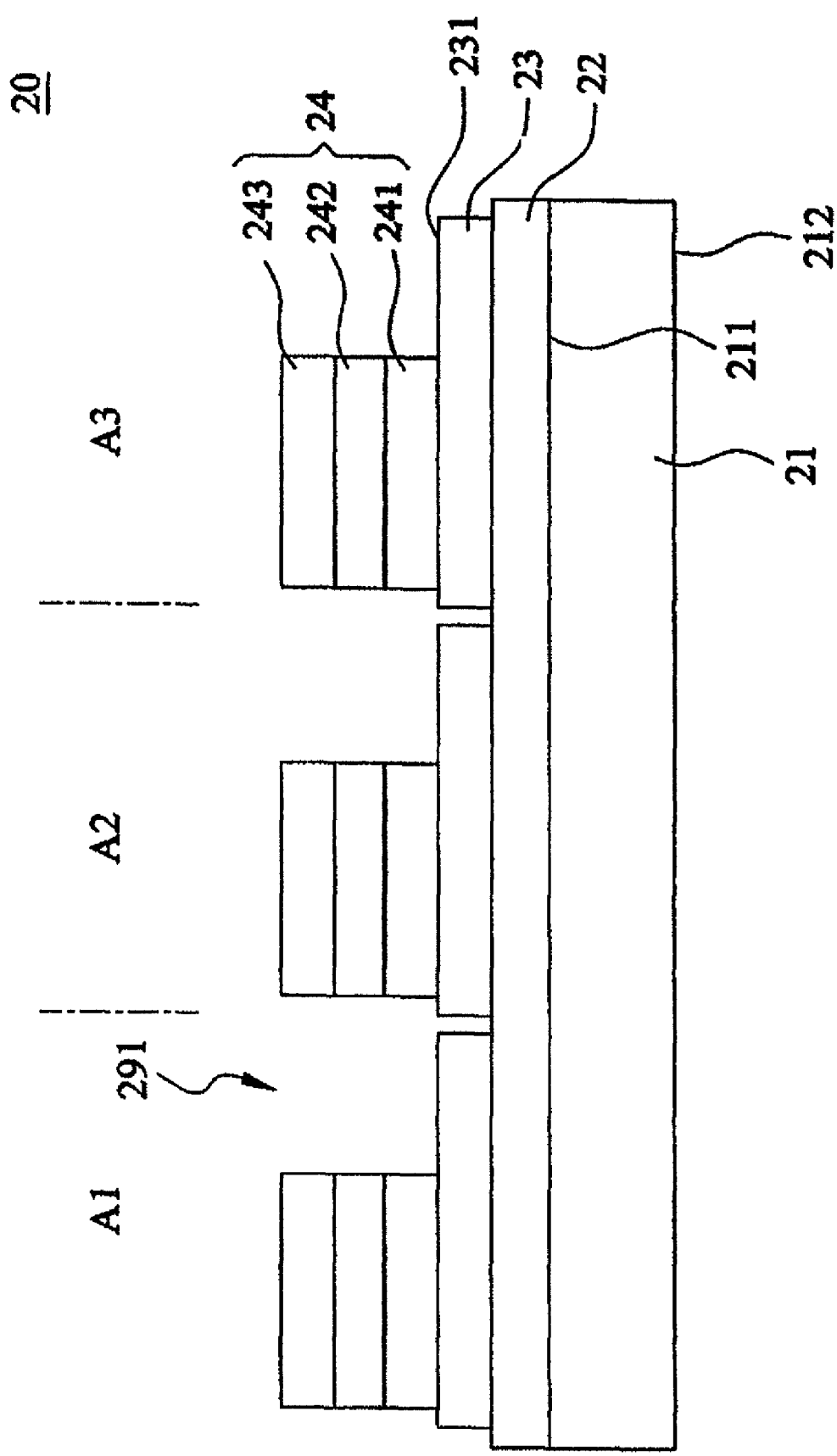
FIG. 2 is a sectional view of an LED structure according to one embodiment of the present invention, showing unit division accomplished.

FIG. 2 is a sectional view of the LED structure 20 after unit division. Each of LEDs 28 according to the present invention includes the first ohmic contact layer 23 and the epi-layer 24 settled on the common first substrate 21 and adhering layer 22. Thus, unit division has to be performed on only the first ohmic contact layers 23 and the epi-layers 24 to form units as indicated by A1, A2 and A3 of FIG. 2 or indicated by B1, B2 and B3 of FIG. 6A.

The first ohmic contact layers 23 are formed on the adhering layer 22. Each of the first ohmic contact layers 23 may be a p-type ohmic contact layer. Besides, the first ohmic contact layers 23 initially formed on the wafer may be divided into units through the etching method.

Each of the epi-layers 24 is an LED 28 single-structure and may be also divided into units through the etching method. A first trench 291 is formed on the epi-layer 24 through an etching process. The first trench 291 causes an exposed portion 231 of the first ohmic contact layer 23 so as to facilitate installing the second electrically conducting plate 27. Due to the second electrically conducting plates 27, the LEDs 28 of the different units can be easily connected in serial/parallel, thereby allowing easy fabrication of high-voltage LEDs 28.

Figure 3A:
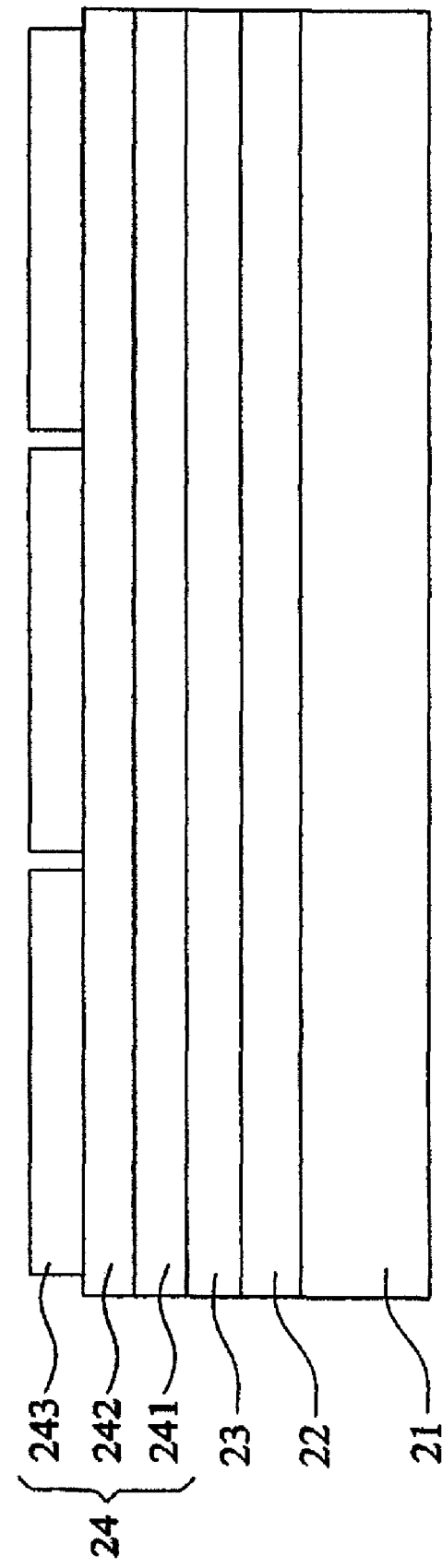
FIG. 3A is a schematic drawing according to FIG. 2 illustrating a first etching process.
Figure 3B:
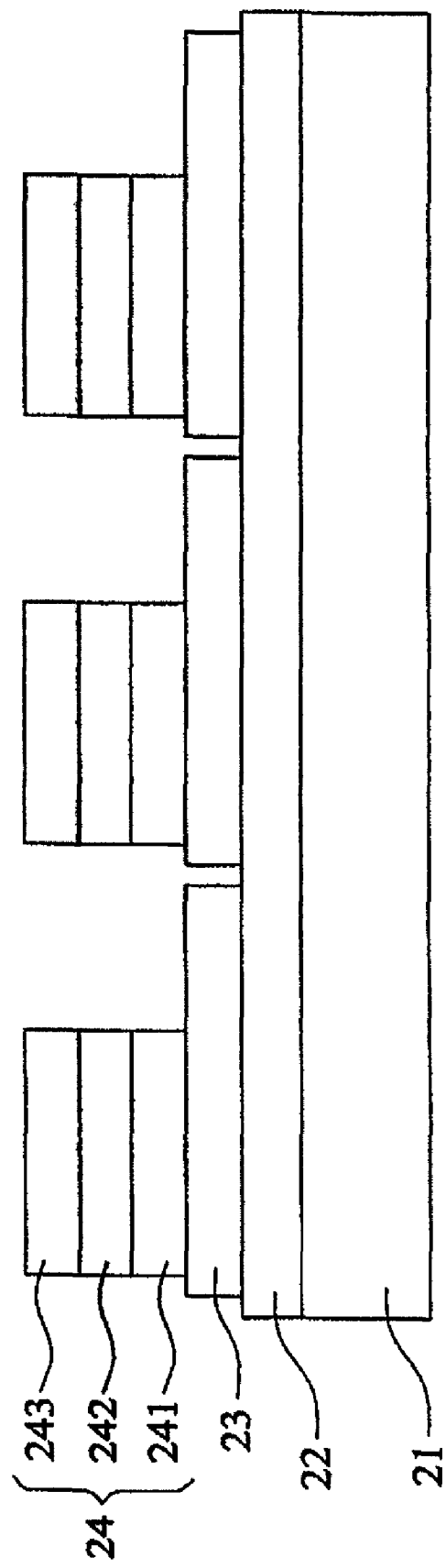
FIG. 3B is a schematic drawing according to FIG. 3A illustrating a second etching process successively conducted.

Please refer to FIGS. 3A and 3B. FIG. 3A is a schematic drawing according to FIG. 2 illustrating a first etching process. FIG. 3B is a schematic drawing according to FIG. 3A illustrating a second etching process successively conducted. The unit division of the first ohmic contact layers 23 and the formation of the first trenches 291 may be achieved through different etching procedures. Among plural etching approaches, one convenient approach is to form two gaps corresponding to intervals between the first ohmic contact layers 23 through a first etching process and then broaden the gaps to the intended width of the first trenches 291 through a second etching process.

Each said epi-layer 24 includes at lease a lower cladding layer 241, an active layer 242 and an upper cladding layer 243. Each said lower cladding layer 241 is formed on one said first ohmic contact layer 23. The lower cladding layer 241 may be a p-type AlGaInP cladding layer. The active layer 242 is formed on the lower cladding layer 241 and may be in the form of a single hetero-structure (SH), a double hetero-structure (DH) or multiple quantum wells (MQW). The upper cladding layer 243 is formed on the active layer 242 and may be an n-type AlGaInP cladding layer. A second ohmic contact layer 292 may be formed between the upper cladding layer 243 and the first electrically conducting plate 26.

Figure 4:
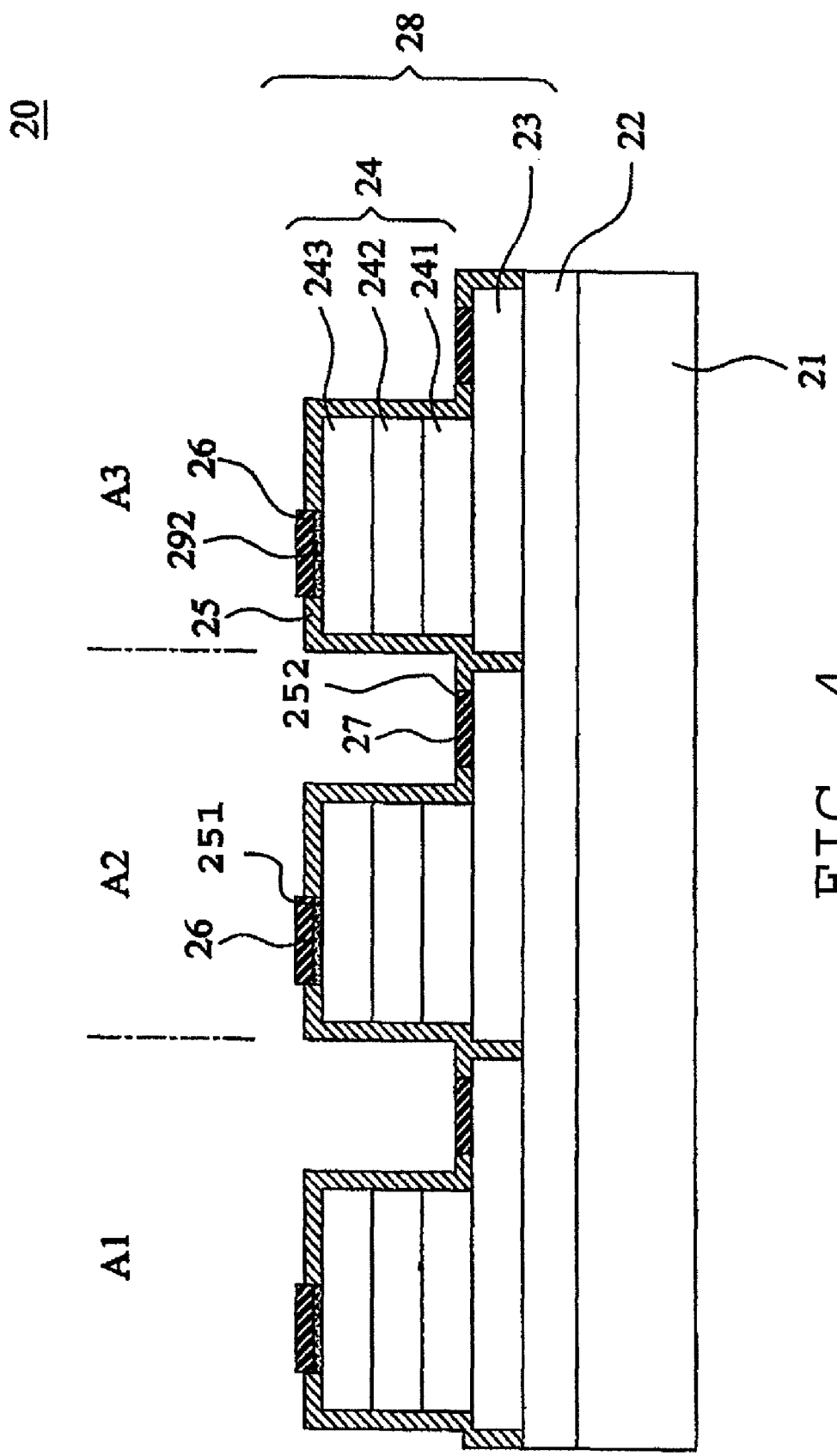
FIG. 4 is a sectional view of the LED structure of FIG. 2 showing a first isolation layer and electrically conducting plates installed.

FIG. 4 is a sectional view of the LED structure of FIG. 2 wherein the first isolation layer 25 and electrically conducting plates are formed. The first isolation layer 25 is made of, for example, SiO, and covers exposed surfaces of the first ohmic contact layers 23 and the upper cladding layers 243, while also being formed between each two adjacent said first ohmic contact layers 23. The first isolation layer 25 helps to not only isolate the LEDs 28 of the different units, but also protect the LEDs 28 from damage caused by external adverse factors, such as moisture, thereby maximizing the service life of the LEDs 28. On the first isolation layer 25, first openings 251 and second openings 252 are formed at the upper cladding layers 243 and the exposed portions 231 of the first ohmic contact layers 23, respectively. The first openings 251 and second openings 252 are formed by etching the finished first isolation layer 25.

Each of the first electrically conducting plates 26 is formed in a relative said first opening 251 and electrically connected to the corresponding upper cladding layer 243.

Each of the second electrically conducting plates 27 is formed in a relative said second opening 252 at each said unit and electrically connected to the corresponding first ohmic contact layer 23.

The first electrically conducting plates 26 and second electrically conducting plates 27 serve to provide power and thus enable the epi-layers 24 to emit light.

When the LED structure 20 is designed as a face-up structure, the first substrate 21 is a transparent substrate and the adhering layer 22 is a transparent adhering layer. Besides, a mirror layer (not shown) is formed on the second surface 212 of the first substrate 21 so as to reflect the light emitted by the epi-layers 24 and thus achieve better light extraction efficiency of the LED structure 20. Alternatively, when the adhering layer 22 is a transparent adhering layer and a mirror layer (not shown) is formed between the first substrate 21 and the adhering layer 22, the light emitted by the epi-layers 24 can be also reflected and thus better light extraction efficiency of the LED structure 20 can be also achieved.

Figure 5A:
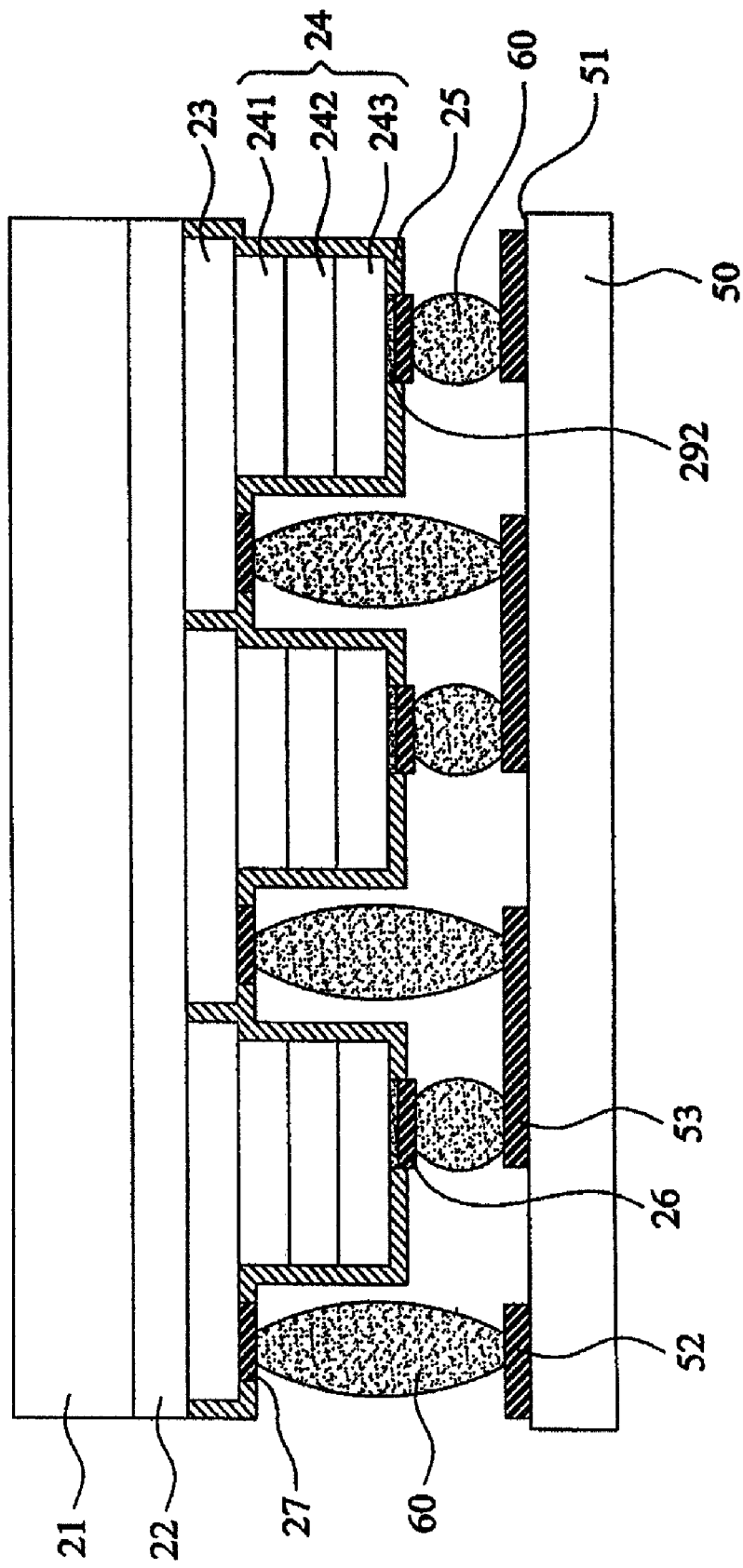
FIG. 5A is sectional view of the LED structure assembled to a submount according to one embodiment of the present invention.
Figures 5B, 5C:
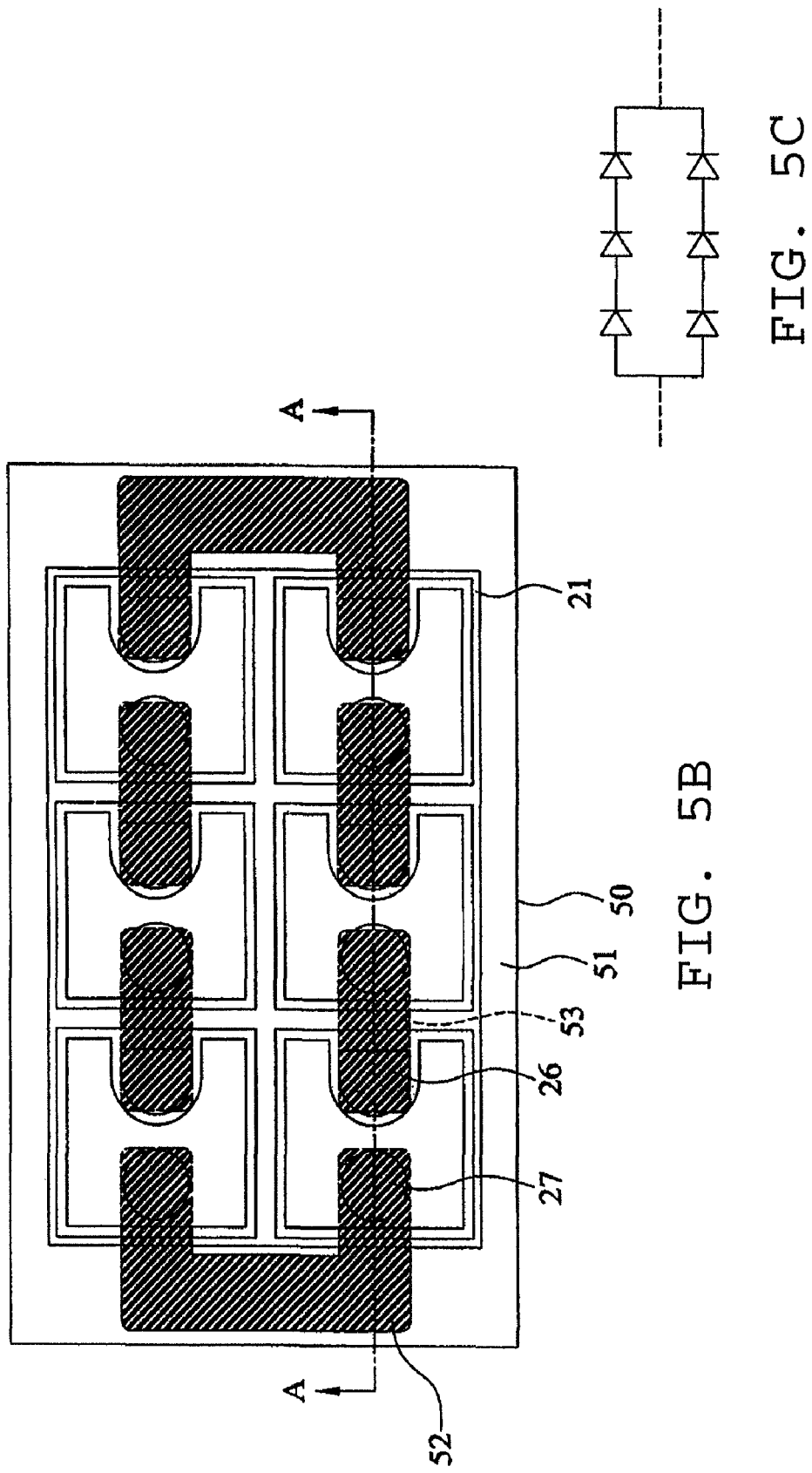
FIG. 5B is a top view of FIG. 5A.
FIG. 5C is an equivalent circuit diagram according to FIG. 5A.

FIG. 5A is sectional view of the LED structure 20 assembled to a submount 50 taken along Line A-A of FIG. 5B. FIG. 5B is a top view of FIG. 5A. FIG. 5C is an equivalent circuit diagram according to FIG. 5A. The LED structure 20 may further include a submount 50 so as to form a flip-chip structure. In the flip-chip structure, the first substrate 21 is a transparent substrate and the adhering layer 22 is a transparent adhering layer. The submount 50 has at least a third surface 51. The third surface 51 is formed with at least two third electrically conducting plates 52 and at least two fourth electrically conducting plates 53. Each of the third electrically conducting plates 52 and the fourth electrically conducting plates 53 is electrically connected to the corresponding first electrically conducting plate 26 and/or the second electrically conducting plate 27 via one or more solder joints 60. The third electrically conducting plates 52 and the fourth electrically conducting plates 53 may be expanded to achieve direct electrical connection. Alternatively, plural traces (not shown) may be provided on the submount 50 for electrically connecting the third electrically conducting plates 52 and the fourth electrically conducting plates 53. Consequently, a complex circuit layout can be formed through the aforesaid bonding manner. The submount 50 allows serial/parallel connection between LEDs 28 to be formed thereon. Since the submount 50 is relatively flexible in area and thickness, it caters for even a very complicated circuit layout, thereby promising the improved variety of the LED structure 20 to meet various applications.

The submount 50 may be a silicon substrate, a printed circuit board (PCB), or a ceramic substrate. For example, the submount 50 may be made of $Al_2O_3$, AlN, BeO, low temperature cofired ceramic (LTCC) or high temperature cofired ceramic (HTCC).

In the flip-chip structure, for obtaining better light extraction efficiency of the LEDs 28, a mirror layer may be further formed on the third surface 51 of the submount 50 while not covering the third electrically conducting plates 52 and the fourth electrically conducting plates 53. Alternatively, a mirror layer may be formed on the first isolation layer 25. That is, a mirror layer may be formed on exposed surfaces of the first isolation layer 25.

The mirror layers may be made of Al, Ag, Au, etc. It is to be noted that when the mirror layer is electrically conductive, it should contact neither the third electrically conducting plates 52 nor the fourth electrically conducting plates 53 and it should contact neither the first electrically conducting plates 26 nor the second electrically conducting plates 27. More preferably, the mirror layer is separated from each of the electrically conducting plates by a certain distance so as to prevent short circuits between the electrically conducting plates.

Figure 6A:
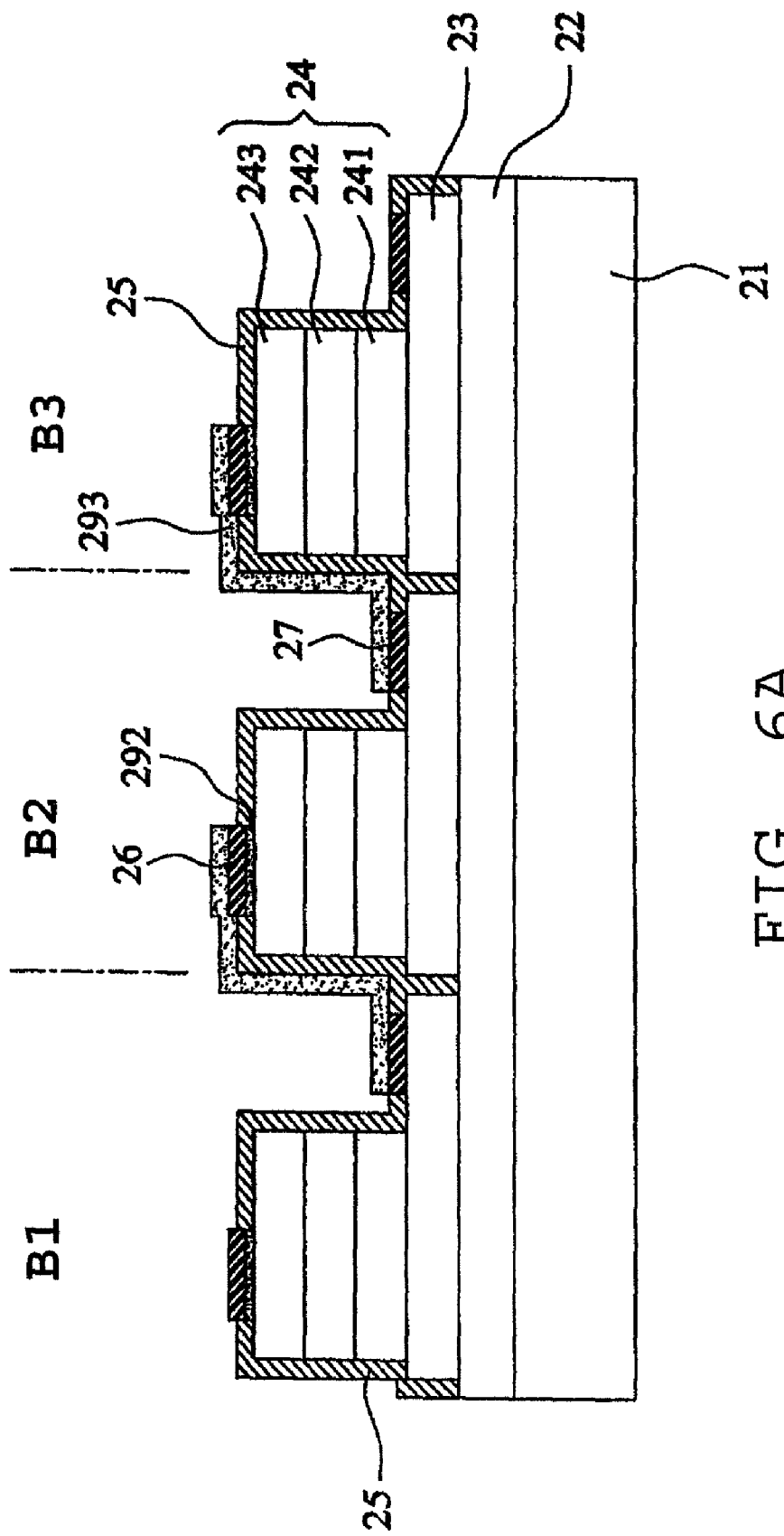
FIG. 6A is a cross-sectional view of the LED structure having a first conductor layer according to one embodiment of the present invention.
Figure 6B:
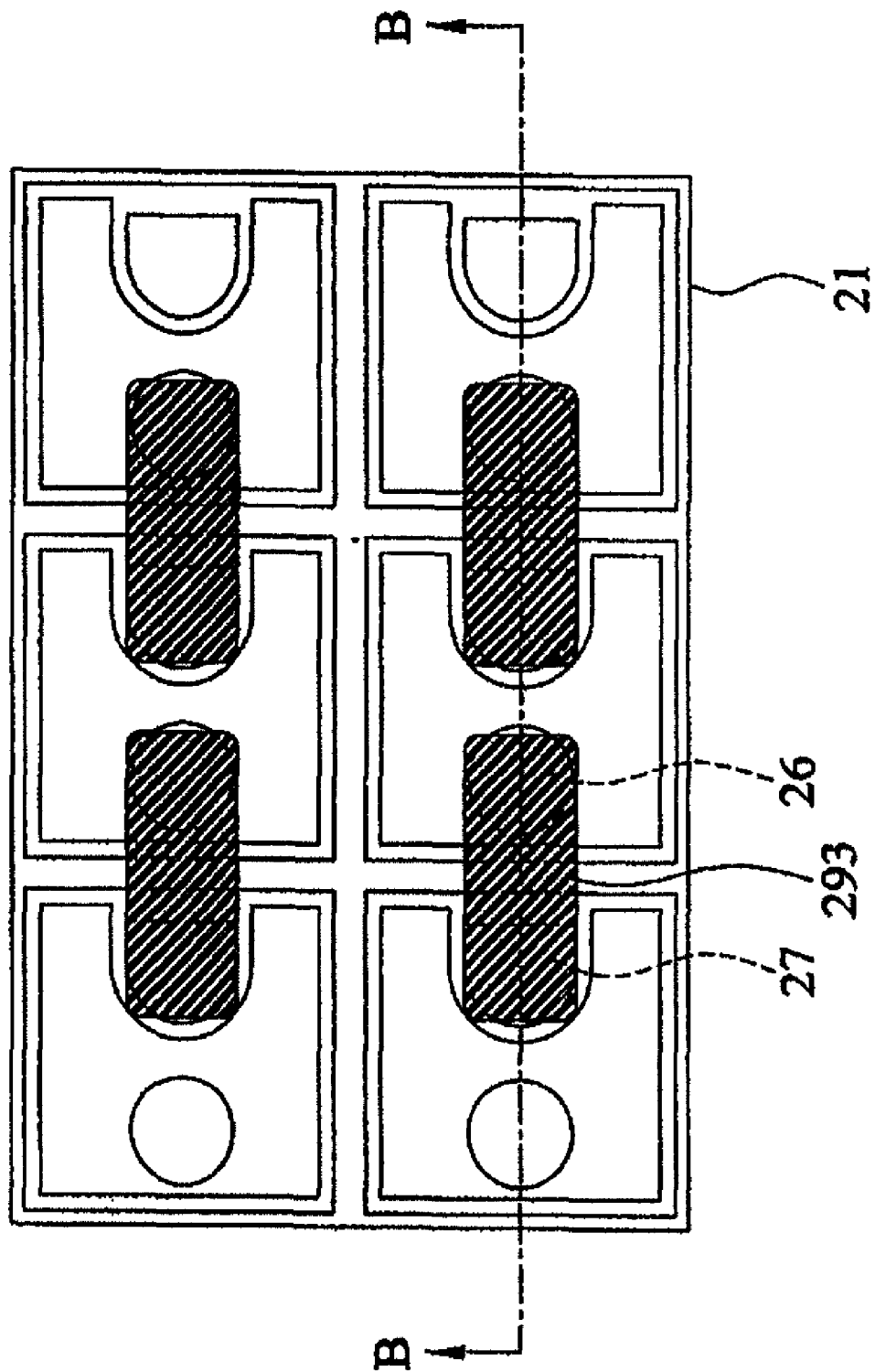
FIG. 6B is a top view of FIG. 6A.

Please refer to FIGS. 6A and 6B. FIG. 6A illustrates the LED structure 20 with a first conductor layer 293 and is taken along Line B-B of FIG. 6B. FIG. 6B is a top view of FIG. 6A. Therein, the LED structure 20 further includes the first conductor layer 293. The first conductor layer 293 is formed with at least one conductor and covers the first isolation layer 25. Besides, two ends of the conductor are connected to the second electrically conducting plate 27 and the first electrically conducting plate 26 of different units, respectively. Thereby, the LEDs 28 can be easily connected in serial/parallel. With the support from the first isolation layer 25, the first conductor layer 293 can be freely designed to cater for a complex circuit layout.

Second Preferred Embodiment

Figure 7:
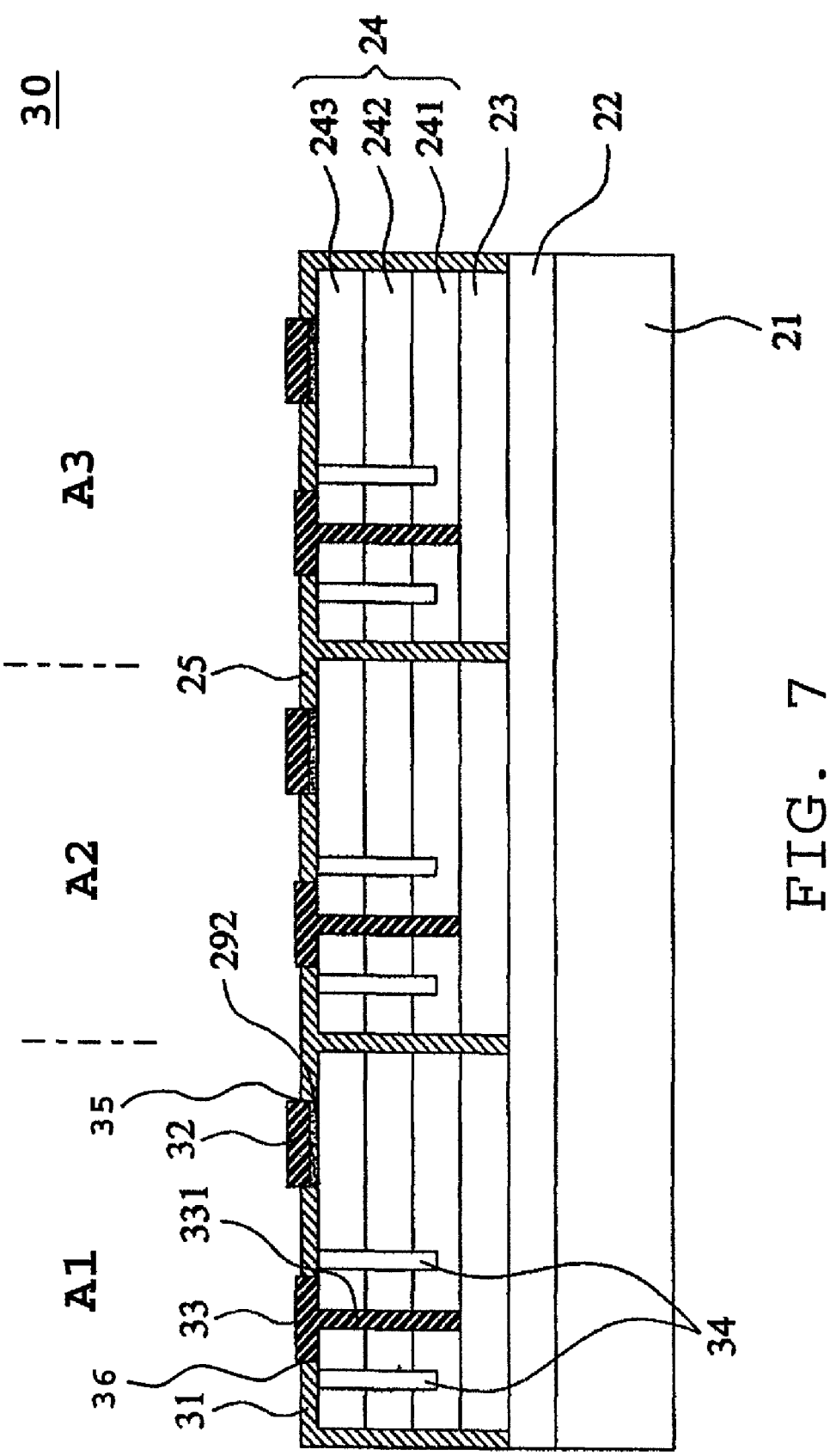
FIG. 7 is a sectional view of the LED structure according to another embodiment of the present invention where unit division, division of epi-layers, and first trenches have been accomplished.
Figure 8:
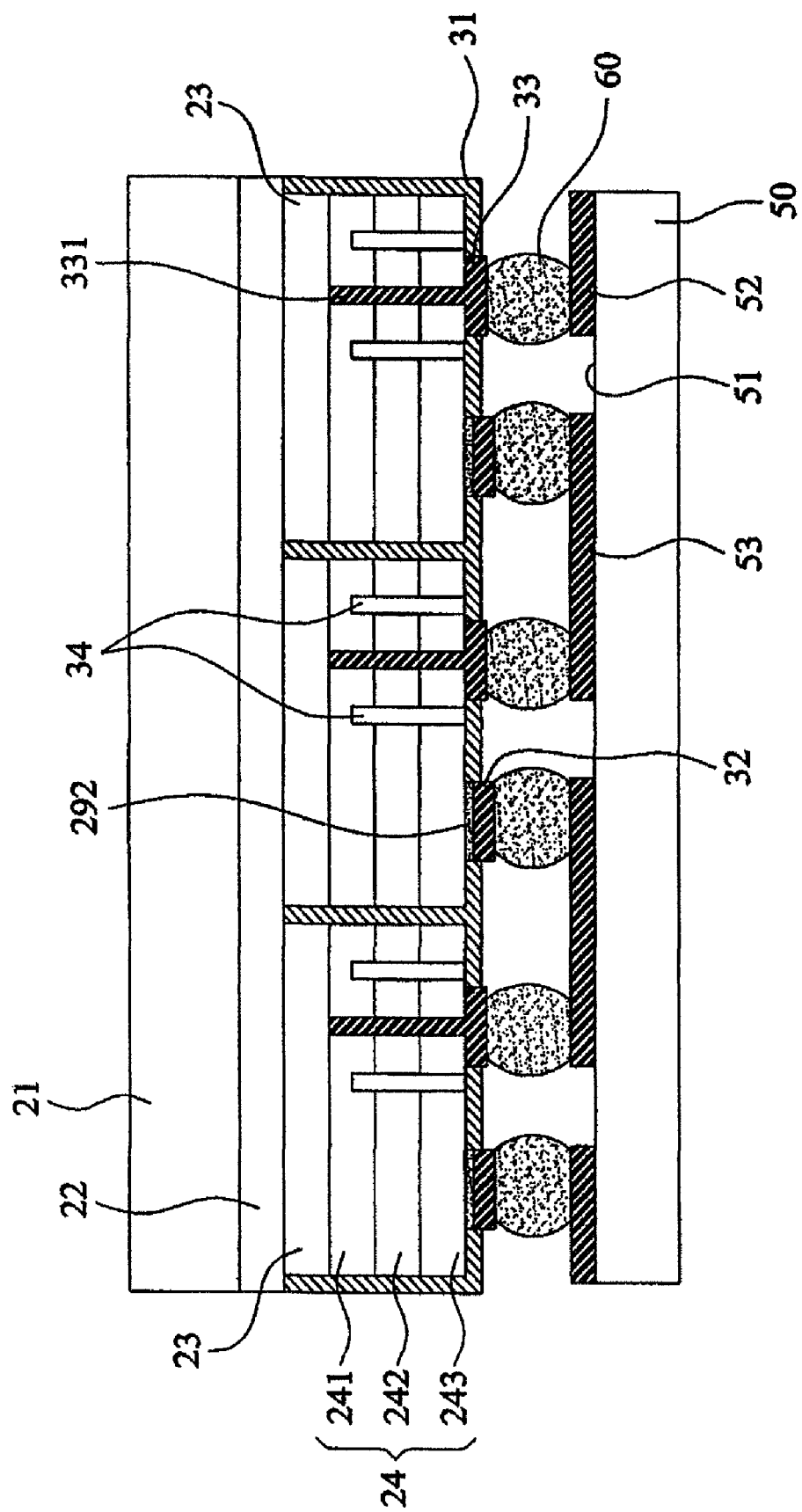
FIG. 8 is a cross-sectional view showing the LED structure of the present invention further assembled with a submount.
Figure 9:
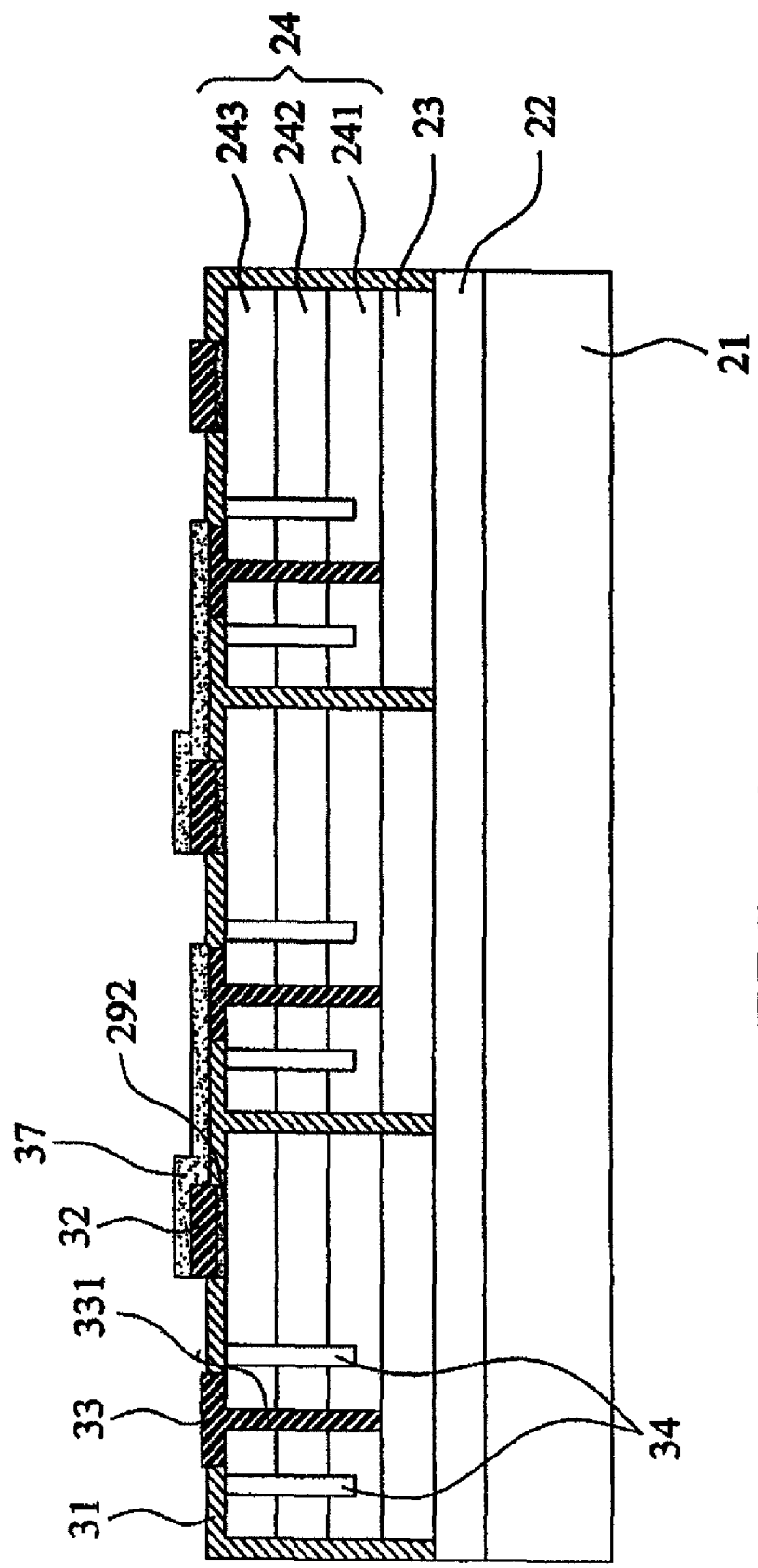
FIG. 9 is a cross-sectional view of the LED structure having a second conductor layer according to the present invention.
Figure 10A:
FIGS. 10A to 10G provide circuit diagrams of various, exemplificative high-voltage LEDs.
Figure 10B:
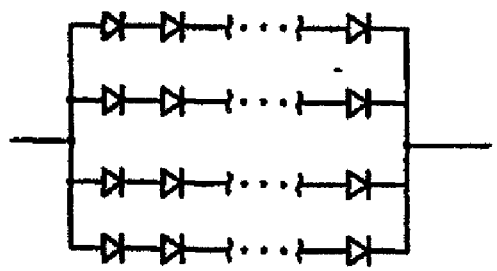
Figure 10C:
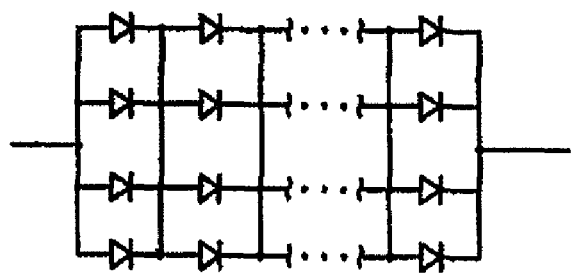
Figure 10D:
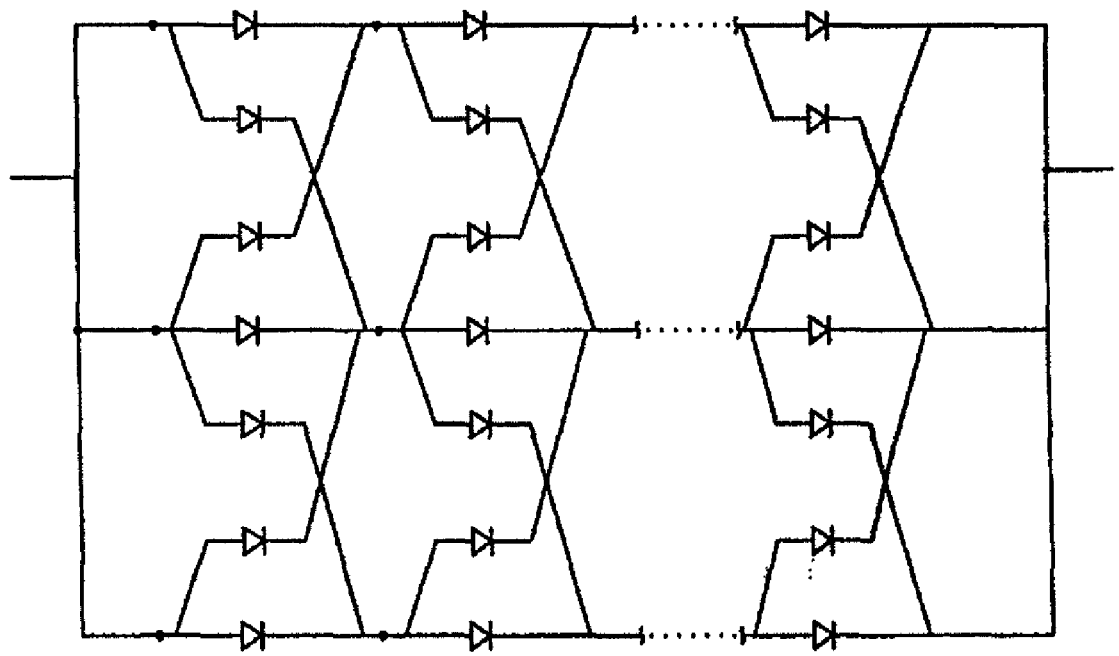
Figure 10E:
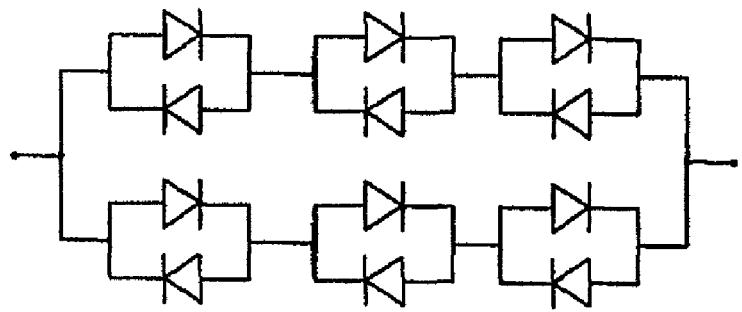
Figure 10F:
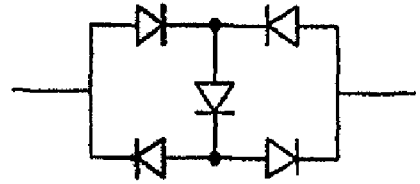
Figure 10G:
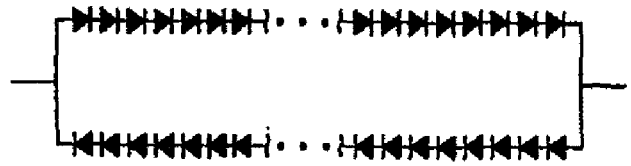

Please refer to FIGS. 7 to 9 for the LED structure 30 according to another embodiment of the present invention. The LED structure 30 includes a first substrate 21, an adhering layer 22, at least two first ohmic contact layers 23, at least two epi-layers 24, a first isolation layer 31, at least two first electrically conducting plates 32, and at least two second electrically conducting plates 33.

The LED structure 30 of the present embodiment may be also made through the process for the first embodiment as shown in FIGS. 1A to 1C. Similarly, the first substrate 21 with the adhering layer 22 attached thereto is bound with the pre-processing LEDs 28. Then the temporary substrate 11 and the etch-stop layer 12 are removed therefrom by etching so as to obtain the pre-unit-division LED structure 30.

The first substrate 21 has a first surface 211 and a second surface 212 and primarily serves to support the whole LED structure 30. The first substrate 21 may be a monocrystal substrate, a polycrystal substrate, or a noncrystal substrate, such as a substrate made of glass, sapphire, SiC, GaP, GaAsP, ZnSe, ZnS, AmSSe, etc. Besides, the first substrate 21 may be a transparent substrate or an opaque substrate depending on the desired light-emitting directions or mirror-layer arrangement of the LED structure 30. When dual-direction light-emitting allowing upward/downward light-emitting is desired, the first substrate 21 has to be transparent.

The adhering layer 22 is formed on the first surface 211 for combining the first substrate 21 and the first ohmic contact layers 23. The adhering layer 22 is one selected from B-staged benzocyclobutene (BCB), epoxy, silicone, polymethyl methacry (PMMA), a polymer, and spin-on glass (SOG). The adhering layer 22 may be a transparent adhering layer or an opaque adhering layer depending on the light-emitting directions or mirror-layer arrangement of the LED structure 30. When dual-direction light-emitting allowing upward/downward light-emitting is desired, the adhering layer 22 has to be transparent.

FIG. 7 is a sectional view of the LED structure 30 wherein unit division, division of epi-layers 24, and first trenches 34 have been accomplished. Since the LED structures 30 according to the present embodiment also share the common first substrate 21 and adhering layer 22, unit division has to be performed on only the first ohmic contact layers 23 and the epi-layers 24 so as to form units as indicated by A1, A2 and A3.

The first ohmic contact layers 23 are formed on the adhering layer 22. Each of the first ohmic contact layers 23 may be a p-type ohmic contact layer. Besides, the first ohmic contact layers 23 initially formed on the wafer may be divided into the units through the etching method.

Each of the epi-layers 24 is an LED 28 single-structure and may be also divided into units through the etching method. Each said epi-layer 24 includes a lower cladding layer 241, an active layer 242, an upper cladding layer 243 and a second first 34.

Each said lower cladding layer 241 is formed on one said first ohmic contact layer 23. The lower cladding layer 241 may be a p-type AlGaInP cladding layer.

The active layer 242 is formed on the lower cladding layer 241 and may be in the form of a single hetero-structure (SH), a double hetero-structure (DH) or multiple quantum wells (MQW).

The upper cladding layer 243 is formed on the active layer 242 and may be an n-type AlGaInP cladding layer.

The first trench 34 is formed through an etching process. The first trench 34 vertically passes through the upper cladding layer 243 and the active layer 242, and enters a part of the lower cladding layer 241. The first trench 34 enables electrical isolation between the active layers 242 and the upper cladding layers 243 at its two sides. For the sack of convenient production, the first trench 34 may be such formed that the second electrically conducting plate 33 is encircled therein so that the active layers 242 can be effectively isolated while an extending portion 331 of the second electrically conducting plate 33 successively conducts the power to the first ohmic contact layers 23. Besides, for facilitating successive processes, when the first isolation layer 31 is formed, the first trenches 34 can be filled with the first isolation layer 31.

The first isolation layer 31 is made of, for example, SiO. The first isolation layer 31 covers exposed surfaces of the upper cladding layers 243, while also being formed between each two adjacent said epi-layers 24 and any two adjacent said first ohmic contact layers 23. The first isolation layer 31 helps to not only isolate the LEDs 28 of the different units, but also protect the LEDs 28 from damage caused by external adverse factors, such as moisture, thereby maximizing the service life of the LEDs 28. On the first isolation layer 31, first openings 35 and second openings 36 are formed at the upper cladding layers 243 and inner sides of the first trenches 34, respectively. The first openings 35 and second openings 36 are formed by etching the finished first isolation layer 31.

Each of the first electrically conducting plates 32 is formed in a relative said first opening 35 and electrically connected to the corresponding upper cladding layer 243. In addition, a second ohmic contact layer 292 may be formed between the upper cladding layer 243 and the first electrically conducting plate 32.

Each of the second electrically conducting plates 33 is formed in a relative said second opening 36 and has an extending portion 331 extending downward. The extending portion 331 vertically passes through the epi-layer 24 and electrically connected to the corresponding first ohmic contact layer 23. The first electrically conducting plates 32 and second electrically conducting plates 33 serve to provide power and thus enable the epi-layers 24 to emit light.

When the LED structure 30 is designed as a face-up structure, the first substrate 21 is a transparent substrate and the adhering layer 22 is a transparent adhering layer. Besides, a mirror layer is formed on the second surface 212 of the first substrate 21 so as to reflect the light emitted by the epi-layers 24 and thus achieve better light extraction efficiency of the LED structure 30. Alternatively, when the adhering layer 22 is a transparent adhering layer and a mirror layer is formed between the first substrate 21 and the adhering layer 22, the light emitted by the epi-layers 24 can be also reflected and thus better light extraction efficiency of the LED structure 30 can be also achieved.

FIG. 8 is sectional view of the LED structure 30 of the present invention assembled to a submount. The LED structure 30 further includes the submount 50 so as to form a flip-chip structure. In the flip-chip structure, the first substrate 21 is a transparent substrate and the adhering layer 22 is a transparent adhering layer. The submount 50 has at least a third surface 51. The third surface 51 is formed with at least two third electrically conducting plates 52 and at least two fourth electrically conducting plates 53. Each of the third electrically conducting plates 52 and the fourth electrically conducting plates 53 is electrically connected to the corresponding first electrically conducting plate 32 and/or the second electrically conducting plate 33 via one or more solder joints 60. The third electrically conducting plates 52 and the fourth electrically conducting plates 53 may be expanded to achieve direct electrical connection. Alternatively, plural traces (not shown) may be provided on the submount 50 for electrically connecting the third electrically conducting plates 52 and the fourth electrically conducting plates 53. Consequently, a complex circuit layout can be formed through the aforesaid bonding manner. The submount 50 allows serial/parallel connection between LEDs 28 to be formed thereon. Since the submount 50 is relatively flexible in area and thickness, it caters for even a very complicated circuit layout, thereby promising the improved variety of the LED structure 30 to meet various applications.

The submount 50 may be a silicon substrate, a printed circuit board (PCB), or a ceramic substrate. For example, the submount 50 may be made of $Al_2O_3$, AlN, BeO, low temperature cofired ceramic (LTCC) or high temperature cofired ceramic (HTCC).

In the flip-chip structure, for obtaining better light extraction efficiency of the LEDs 28, a mirror layer may be further formed on the third surface 51 of the submount 50 while not covering the third electrically conducting plates 52 and the fourth electrically conducting plates 53. Alternatively, a mirror layer may be formed on the first isolation layer 31. That is, a mirror layer may be formed on exposed surfaces of the first isolation layer 31.

The mirror layers may be made of Al, Ag, Au, etc. It is to be noted that when the mirror layer is electrically conductive, it should contact neither the third electrically conducting plates 52 nor the fourth electrically conducting plates 53 and it should contact neither the first electrically conducting plates 32 nor the second electrically conducting plates 33. More preferably, the mirror layer is separated from each of the electrically conducting plates by a certain distance so as to prevent short circuits between the electrically conducting plates.

For easy interconnection between the LEDs 28 of the LED structure 30, and for neat and integral combination between the LED structure 30 and the submount 50, all surfaces of the first electrically conducting plates 32 and the second electrically conducting plates 33 have the same altitude, thereby facilitating operation of the process.

FIG. 9 illustrates the LED structure 30 with a second conductor layer 37. Therein, the LED structure 30 further includes the second conductor layer 37. The second conductor layer 37 is formed with at least one conductor and covers the first isolation layer 31. Besides, two ends of the conductor are connected to the first electrically conducting plate 32 and the second electrically conducting plate 33 of different units, respectively. Thereby, the LEDs 28 can be easily connected in serial/parallel. With the support from the first isolation layer 31, the second conductor layer 37 can be freely designed to cater for a complex circuit layout.

FIGS. 10A to 10G provide circuit diagrams of various, exemplificative high-voltage LEDs 28 according to the present invention. Since the LED structure of the present invention has the integral first isolation layer 25 or 31, the complicated circuit layouts as shown in FIGS. 10A to 10G can be easily made on the first isolation layer 25 or 31. Particularly, when the submount 50 is implemented to form the flip-chip structure, achievement of these circuit layouts can be even more available.

The present invention has been described with reference to the preferred embodiment and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

INDUSTRIAL APPLICABILITY

The present invention is related to an LED structure. The LED structure of the present invention comprises: a first substrate; an adhering layer formed on the first surface; first ohmic contact layers formed on the adhering layer; epi-layers formed on the first ohmic contact layers; a first isolation layer covering exposed surfaces of the first ohmic contact layers and the epi-layers; and first electrically conducting plates and second electrically conducting plates formed in the first isolation layer and electrically connected to ends of the first ohmic contact layer and the epi-layer. By implementing the above technical means, the present invention features for at least the following advantages and benefits related to industrial applications:

1. The trenches allow the LED structure to facilitate complex serial/parallel connection so as to achieve easy and various applications of the LED structure in the form of single structures under a high-voltage environment.

2. The present invention enables convenient interconnection between LEDs, and easy manufacture of LED single-structures operable in a high-voltage environment, thereby improving utility of the LED structure.

3. An LED structure according to the present invention can be produced through a simple semiconductor process. In such LED structure, since only a submount requires an additional mask and the existing process is applicable to the disclosed LED structure, the cost is relatively low and thus the manufacture is beneficial, thereby ensuring industrial applicability of the present invention.

4. Since an interconnection layout between the LED structures of the present invention is achievable by using submounts, design of junction circuits is simplified.

5. As compared with metal-to-metal adherence that requires high heat operation, the adhering layer of the present invention needs only economical low-temperature operation and provides the advantages of low costs and high yield.

6. The present invention facilitates simplifying the junction circuit and enables high-voltage LED chips being compact and having high luminance, thereby downsizing and lightening resultant LED lighting devices.

What is claimed is:

1. A light emitting diode (LED) structure, comprising:
   a first substrate having a first surface and a second surface;
   an adhering layer formed on the first surface;
   at least two first ohmic contact layers formed on the adhering layer;
   at least two epi-layers wherein a first trench is formed between each two adjacent said epi-layers, and each said epi-layer includes:
   a lower cladding layer formed on one of said first ohmic contact layers;
   an active layer formed on the lower cladding layer; and
   an upper cladding layer formed on the active layer;
   a first isolation layer covering exposed surfaces of the one of said first ohmic contact layers and the upper cladding layers, and formed between each two adjacent said first ohmic contact layers, wherein the first isolation layer has first openings and second openings formed at the exposed surfaces of the upper cladding layers and the first ohmic contact layers, respectively;
   at least two first electrically conducting plates, each formed in one said first opening and electrically connected to one said upper cladding layer; and
   at least two second electrically conducting plates, each formed in one said second opening and electrically connected to one of said first ohmic contact layers.

2. The LED structure of claim 1, wherein each of the first ohmic contact layers is a p-type ohmic contact layer.

3. The LED structure of claim 1, wherein the lower cladding layer is a p-type AlGaInP cladding layer and the upper cladding layer is an n-type AlGaInP cladding layer.

4. The LED structure of claim 1, wherein the active layer is in a form of a single hetero-structure (SH), a double hetero-structure (DH) or multiple quantum wells (MQW).

5. The LED structure of claim 1, wherein a second ohmic contact layer is formed between the upper cladding layer and the first electrically conducting plates.

6. The LED structure of claim 1, wherein the first substrate is a transparent substrate and the adhering layer is a transparent adhering layer, and a mirror layer is formed on the second surface.

7. The LED structure of claim 1, wherein the adhering layer is a transparent adhering layer, and a mirror layer is formed between the first substrate and the adhering layer.

8. The LED structure of claim 1, further comprising a submount that has a third surface whereon at least two third electrically conducting plates and at least two fourth electrically conducting plates are formed, wherein the submount is formed with a plurality of traces for electrically connecting the third electrically conducting plates and the fourth electrically conducting plates, each of the third electrically conducting plates and the fourth electrically conducting plates being electrically connected to the corresponding first electrically conducting plates and/or the second electrically conducting plates via one or more solder joints, and the first substrate being a transparent substrate while the adhering layer being a transparent adhering layer.

9. The LED structure of claim 8, wherein a mirror layer is formed on the third surface while not covering the third and fourth electrically conducting plates.

10. The LED structure of claim 8, wherein a mirror layer is formed on the first isolation layer.

11. The LED structure of claim 1, further comprising a first conductor layer that is formed with at least one conductor and covers the first isolation layer, each conductor having two opposite ends electrically connected to the second electrically conducting plates and the first electrically conducting plates of different units, respectively.

12. A light emitting diode (LED) structure, comprising:
   a first substrate having a first surface and a second surface;
   an adhering layer formed on the first surface;
   at least two first ohmic contact layers formed on the adhering layer;
   at least two epi-layers, wherein each said epi-layer includes:
   a lower cladding layer formed on one of said first ohmic contact layers;
   an active layer formed on the lower cladding layer;
   an upper cladding layer formed on the active layer; and
   a first trench vertically passing through the upper cladding layer and the active layer and entering a part of the lower cladding layer;
   a first isolation layer covering the upper cladding layers and formed between each two adjacent said epi-layers and between each two adjacent said first ohmic contact layers, wherein the first isolation layer has a first opening formed on each said upper cladding layer and a second opening formed at an inner side of each said first trench;
   at least two first electrically conducting plates, each formed in one said first opening and electrically connected to one said upper cladding layer; and
   at least two second electrically conducting plates, each formed in one said second opening, having an extending portion extending downward to vertically pass through a corresponding one of said epi-layers and electrically connect with a corresponding one of said first ohmic contact layers.

13. The LED structure of claim 12, wherein each of the first ohmic contact layers is a p-type ohmic contact layer.

14. The LED structure of claim 12, wherein the lower cladding layer is a p-type AlGaInP cladding layer and the upper cladding layer is an n-type AlGaInP cladding layer.

15. The LED structure of claim 12, wherein the active layer is in a form of a single hetero-structure (SH), a double hetero-structure (DH) or multiple quantum wells (MQW).

16. The LED structure of claim 12, wherein the first trench has the first isolation layer formed therein.

17. The LED structure of claim 12, wherein a second ohmic contact layer is formed between the upper cladding layer and a corresponding one of the first electrically conducting plates.

18. The LED structure of claim 12, wherein the first substrate is a transparent substrate and the adhering layer is a transparent adhering layer, and a mirror layer is formed on the second surface.

19. The LED structure of claim 12, wherein the adhering layer is a transparent adhering layer, and a mirror layer is formed between the first substrate and the adhering layer.

20. The LED structure of claim 12, further comprising a submount that has a third surface whereon at least two third electrically conducting plates and at least two fourth electrically conducting plates are formed, wherein the submount is formed with a plurality of traces for electrically connecting the third electrically conducting plates and the fourth electrically conducting plates, each of the third electrically conducting plates and the fourth electrically conducting plates being electrically connected to a corresponding one of the corresponding first electrically conducting plates and/or a corresponding one of the second electrically conducting plates via one or more solder joints, and the first substrate being a transparent substrate while the adhering layer being a transparent adhering layer.

21. The LED structure of claim 20, wherein a mirror layer is formed on the submount while not covering the third and fourth electrically conducting plates.

22. The LED structure of claim 20, wherein a mirror layer is formed on the first isolation layer.

23. The LED structure of claim 12, wherein surfaces of the first electrically conducting plates and the second electrically conducting plates have an identical altitude.

24. The LED structure of claim 12, further comprising a second conductor layer that is formed with at least one conductor and covers the first isolation layer, each conductor having two opposite ends electrically connected to a corresponding one of the first electrically conducting plates and a corresponding one of the second electrically conducting plates of different units, respectively.

* * * * *